US012796301B2

(12) United States Patent
Peng et al.

(10) Patent No.: US 12,796,301 B2
(45) Date of Patent: Nov. 10, 2026

(54) DISPLAY PANELS

(71) Applicant: WUHAN CHINA STAR OPTOELECTRONICS SEMICONDUCTOR DISPLAY TECHNOLOGY CO., LTD., Wuhan (CN)

(72) Inventors: Xueyin Peng, Wuhan (CN); Wenxu Xianyu, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 394 days.

(21) Appl. No.: 18/523,326

(22) Filed: Nov. 29, 2023

(65) Prior Publication Data

US 2024/0268203 A1 Aug. 8, 2024

(30) Foreign Application Priority Data

Jan. 31, 2023 (CN) ......................... 202310098882.9

(51) Int. Cl.
*H10K 59/80* (2023.01)
*H10K 59/10* (2023.01)
(Continued)

(52) U.S. Cl.
CPC ......... *H10K 59/8793* (2023.02); *H10K 59/10* (2023.02); *H10K 59/8731* (2023.02); *H10K 59/60* (2023.02); *H10K 59/70* (2023.02)

(58) Field of Classification Search
CPC ............... H10K 59/8731; H10K 59/40; H10K 59/8791; H10K 59/873; H10K 50/11; H10K 59/1201; H10K 59/38; H10K 59/80518; H10K 59/8722; H10K 59/8792; H10K 59/8793; H10K 71/00; H10K 59/12–1315; H10K 59/80–95; H10K 59/10–221; H10K 59/122; H10K 59/173; H10K 59/125; H10K 50/86; G02F 1/13–1418; G02F 1/133514; G02F 2001/133521; G02F 2001/136222; B32B 2457/202; H05K 2201/10136; H10D 86/40–60;
(Continued)

(56) References Cited

U.S. PATENT DOCUMENTS 3,291,713 A * 12/1966 Parsi ........................ B01J 47/12 204/632
10,139,679 B2 * 11/2018 Yang .................. G02F 1/13439
(Continued)

FOREIGN PATENT DOCUMENTS

CN 115109413 B * 2/2024 ................ C08J 5/18
WO WO-2013099771 A1 * 7/2013 .............. C08J 5/244

*Primary Examiner* — Maliheh Malek
(74) *Attorney, Agent, or Firm* — HSML P.C.

(57) ABSTRACT

Disclosed is a display panel provided by the embodiment of the present disclosure, the display panel includes a substrate, a first inorganic layer disposed on the substrate, a polarizing plate disposed on the first inorganic layer, and an absorption layer, the polarizing plate includes a polarizing layer, the absorption layer is arranged between the polarizing layer and the first inorganic layer, and the absorption layer includes adsorbing particles for adsorbing ammonia gas and/or ammonium ions.

13 Claims, 2 Drawing Sheets

(51) Int. Cl.
*H10K 59/60* (2023.01)
*H10K 59/70* (2023.01)

(58) Field of Classification Search
CPC ....... C09J 2203/318; C09K 19/00–608; G09G 2300/0491; G09G 2300/0486; G09G 2300/0478–0495
See application file for complete search history.

(56) References Cited

U.S. PATENT DOCUMENTS 10,379,395 B2 * 8/2019 Lee .................. G02F 1/133512
10,770,519 B2 * 9/2020 Zhang .................. H10K 59/40
11,991,912 B2 * 5/2024 Gong .................. C08L 1/284
12,101,962 B2 * 9/2024 Sim .................. H10K 59/38
2001/0025958 A1 * 10/2001 Yamazaki .......... G02F 1/13454 349/43
2007/0177071 A1 * 8/2007 Egi .................. G02F 1/133533 349/96
2007/0177084 A1 * 8/2007 Ishitani ............ G02F 1/133528 349/96
2008/0049419 A1 * 2/2008 Ma .................. G02F 1/133611 362/225
2009/0274891 A1 * 11/2009 Sawanobori ....... G02B 27/0006 428/323
2011/0096274 A1 * 4/2011 Shimizu ............ G02F 1/133514 349/106
2012/0007106 A1 * 1/2012 Jung .................. G02B 5/3083 257/E51.018
2013/0250414 A1 * 9/2013 Eguchi .................. G02B 1/111 359/488.01
2019/0081280 A1 * 3/2019 Horikawa .......... H10K 59/1201
2023/0157119 A1 * 5/2023 Choi .................. H10K 59/122 257/40
2024/0032405 A1 * 1/2024 Jeong .................. H10K 59/873
2024/0217886 A1 * 7/2024 Watkins .................. B05D 3/06
2025/0318397 A1 * 10/2025 Baeck .................. H10K 59/38
2025/0338755 A1 * 10/2025 Ji .................. H10K 59/873
2026/0013371 A1 * 1/2026 Sung .................. H10K 59/873

* cited by examiner

DISPLAY PANELS

CROSS-REFERENCE TO RELATED APPLICATION

This application claims priority to and the benefit of Chinese Patent Application No. 202310098882.9, filed on Jan. 31, 2023, the disclosure of which is incorporated herein by reference in its entirety.

TECHNICAL FIELD

The present disclosure relates to a field of display technologies, and in particular, to display panels.

BACKGROUND

In recent years, with the development of the in-vehicle screen, the reliability requirements for the screen become higher and higher, and therefore, a greater test is put forward for the display module material. A more serious problem at present is that the OLED screen may have a phenomenon of discoloring failure of the polarizing plate when stored at high temperatures of more than 95° C. or during double 85 (i.e., 85° C. and 85% humidity).

After analysis, it is found that since a thin film transistor layer, a thin film encapsulation layer, and the like, of the display panel usually have inorganic layers using $SiN_x$ and SiON as materials, in a high temperature process, these inorganic layers may release $NH4^+$, and $NH4^+$ enters a PVA (polyvinyl alcohol) layer in the polarizing plate, and the coordination complex of PVA and iodide ions may be dissociated. After the iodide ions escape, the polarizing plate may appear the discoloring phenomenon.

In summary, there is an urgent need to improve the structure of the conventional display panel so as to solve the problem of discoloring failure of the polarizing plate during high-temperature storage.

SUMMARY

In view of the above, the present disclosure provides the following technical solutions.

An embodiment of the present disclosure provides a display panel including: a substrate; a first inorganic layer disposed on the substrate; a polarizing plate disposed on the first inorganic layer and including a polarizing layer; and an absorption layer disposed between the first inorganic layer and the polarizing plate, the absorption layer includes adsorbing particles for adsorbing ammonia gas and/or ammonium ions.

In some embodiments of the present disclosure, the adsorbent particles include at least one of potassium aluminosilicate, calcium aluminosilicate, sodium aluminosilicate, barium aluminosilicate, or strontium aluminosilicate.

In some embodiments of the present disclosure, a percentage of the adsorbing particles in a total mass of the absorption layer is 8%~12%, and/or a particle size of the adsorbing particles is less than or equal to 200 nm.

In some embodiments of the present disclosure, the absorption layer includes a base in which the adsorbing particles are doped In some embodiments of the disclosure, material of the base includes at least one of cyclic olefin polymer or copolymers of cycloolefin.

In some embodiments of the disclosure, the base has a phase difference of zero, and the polarizing plate is a circular polarizing plate.

In some embodiments of the disclosure, the base has a phase difference of 45°, and the polarizing plate is a linear polarizing plate.

In some embodiments of the present disclosure, the polarizing plate further includes a first protective layer at a side of the polarizing layer away from the first inorganic layer, a second protective layer at a side of the polarizing layer close to the first inorganic layer, and an adhesive layer at a side of the second protective layer close to the first inorganic layer. At least one of the second protective layer or the adhesive layer is further used as a base of the absorption layer.

The polarizing plate further includes a quarter-wave plate located at a side of the polarizing layer close to the first inorganic layer, and the quarter-wave plate is further used as a base of the absorption layer.

In some embodiments of the disclosure, the display panel includes a plurality of inorganic layers, and the first inorganic layer is an inorganic layer of the plurality of inorganic layers furthest away from the substrate.

In some embodiments of the present disclosure, the display panel includes a light emitting layer disposed on the substrate, and a thin film encapsulation layer disposed on the light emitting layer and covering the light emitting layer, and the thin film encapsulation layer includes a second inorganic layer, an organic layer, and the first inorganic layer stacked in sequence in a direction away from the substrate.

The display panel includes a light emitting layer disposed on the substrate, a thin film encapsulation layer disposed on the light emitting layer and covering the light emitting layer, and a touch layer disposed on the thin film encapsulation layer, and the first inorganic layer is disposed on the touch layer and covers the touch layer.

Figure 1:
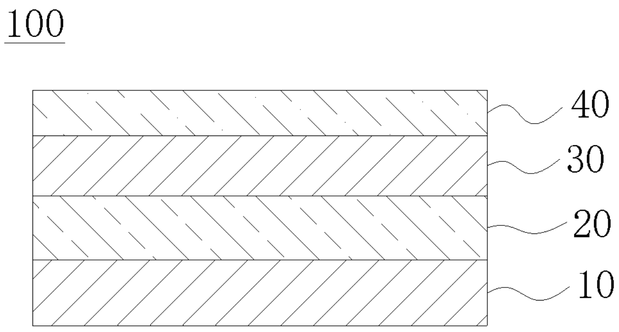
FIG. 1 is a schematic diagram of stacked film layers of a display panel according to an embodiment of the present disclosure.

List of reference signs:

| Reference numerals | Part name | Reference numerals | Part name |
|---|---|---|---|
| 10 | Substrate | 20 | First inorganic layer |
| 30 | Absorption layer | 40 | Polarizing plate |
| 50 | Pixel driving circuit | 60 | Light emitting material layer |
| 70 | Pixel definition layer | 80 | Thin film encapsulation layer |
| 90 | Glue | 81 | Second inorganic layer |
| 82 | Organic layer | 110 | Adhesive layer |
| 120 | Black ink layer | 130 | Cover plate |
| 140 | Back plate | 150 | SCF component |
| 41 | Adhesive layer | 42 | Quarter-wave plate |
| 43 | Second protective layer | 44 | Polarizing layer |
| 45 | First protective layer | 100 | Display panel |
| 31 | Base | 32 | Adsorbing particle |
| M1 | Metal layer | | |

DETAILED DESCRIPTION

Technical solutions in embodiments of the present disclosure will be clearly and completely described below in conjunction with drawings in the embodiments of the present disclosure. Obviously, the described embodiments are only a part of embodiments of the present disclosure, rather than all the embodiments. Based on the embodiments in the present disclosure, all other embodiments obtained by those skilled in the art without creative work fall within the protection scope of the present disclosure.

In the description of the present disclosure, it is to be understood that the terms "first" and "second" are for illustrative purposes only and are not to be construed as indicating or imposing a relative importance or implicitly indicating the number of technical features indicated. Thus, a feature that limited by "first", "second" may expressly or implicitly include at least one of the features. In the description of the present disclosure, the meaning of "plural" is two or more, unless otherwise specifically defined.

In the present disclosure, it should be noted that unless otherwise clearly defined and limited, a first feature "on (or above, over)" a second feature may mean that the first feature directly contacts the second feature, or that the first feature contacts the second feature via an additional feature therebetween instead of directly contacting the second feature. Moreover, the first feature "on (or above, over)" the second feature may mean that the first feature is right over or diagonally above the second feature or only mean that the first feature has a horizontal height higher than that of the second feature.

The following description provides various embodiments or examples for implementing various structures of the present disclosure. To simplify the description of the present disclosure, parts and settings of specific examples are described as follows. Certainly, they are only illustrative, and are not intended to limit the present disclosure. Further, in the present disclosure, reference numerals and reference letters may be repeated in different examples, which is for purposes of simplicity and clarity and does not indicate a relationship of the various embodiments and/or the settings. Furthermore, the present disclosure provides specific examples of various processes and materials, however, applications of other processes and/or other materials may be appreciated by those skilled in the art.

Referring to FIG. 1, an embodiment of the present disclosure provides a display panel 100, which may be an organic electroluminescent display panel in an embodiment of the present disclosure. The display panel 100 includes a substrate 10, a pixel driving circuit provided on the substrate 10, a light-emitting layer provided on the pixel driving circuit, and a polarizing plate 40.

Figure 2:
FIG. 2 is a schematic diagram of stacked film layers of a polarizing plate according to an embodiment of the present disclosure.

The polarizing plate 40 serves to increase the contrast of the display panel 100 and reduce the reflectivity of the display panel 100. Generally, the polarizing plate 40 is a composite film, as shown in FIG. 2. Specifically, the polarizing plate 40 includes an adhesive layer 41, a second protective layer 43, a polarizing layer 44, and a first protective layer 45 in a direction away from the substrate 10.

The polarizing layer 44 may be a PVA (polyvinyl alcohol) film, the first protective layer 45 and the second protective layer 43 may be a TAC (Triacetyl Cellulose) film, and the adhesive layer 41 includes a pressure-sensitive adhesive. The PVA film is a core material by which the polarizing plate 40 performs a polarization function. The PVA film is capable of polarizing because it can adsorb dichroism molecules. Taking the most widely used iodine-based PVA film in the market as an example, the untreated PVA molecular chains are disorderly distributed, and the iodine molecules adsorbed on the PVA film are also disorderly distributed. When the PVA film is extended and oriented, the iodine molecules on the PVA film are orderly distributed, and the iodine-adsorbed dichroism absorption molecules are extended and oriented, so that the PVA film has the function of polarizing light, thereby determining key optical indexes such as polarization performance, transmittance, and hue of the polarizing plate.

In the related art, a polarizing plate in an organic electroluminescent display panel is generally a circular polarizing plate. The circular polarizing plate corresponds to one polarizing plate and one wave plate. The thickness optical path of the wave plate is ¼ of the wavelength. The polarizing axis of the polarizing plate and the optical axis of the wave plate form an angle of 45 degrees. Natural light is converted into linear polarized light by passing through a polarizing plate, and the linear polarized light is converted into circular polarized light by passing through a quarter-wave plate, then the light is still circular polarized light after being reflected back through a screen body, but in an opposite direction, and the circular polarized light is converted into linear polarized light by returning to the quarter-wave plate, at this time, the vibration direction is perpendicular to the vibration direction of the previous linear polarized light, so that the linear polarized light is absorbed when passing through the polarizing plate again, thereby improving the contrast of the display panel and reducing the reflectivity.

In some embodiments of the present disclosure, the display panel 100 further includes a first inorganic layer 20. The display panel includes a plurality of inorganic layers for insulating and blocking moisture. The first inorganic layer 20 may be an inorganic layer in a pixel driving circuit, or may be an inorganic layer in a thin film encapsulation layer for encapsulating a light-emitting layer. Preferably, the first inorganic layer 20 is an inorganic layer of the plurality of inorganic layers that is furthest away from the substrate 10.

It has been found by the inventors that the organic electroluminescent display panel may have a phenomenon of discoloring failure of the polarizing plate when stored at high temperatures of more than 95° C. or during double 85 (i.e., 85° C. and 85% humidity). This is because the first inorganic layer 20 in the display panel is generally made of $SiN_x$ and SiON materials, during the high temperature process, ammonium ions ($NH_4^+$) are released, and $NH_4^+$ enters the polarizing layer in the polarizing plate 40, the coordination complex of PVA and iodide ions may be dissociated, and the iodide ions escape, thereby causing the polarizing plate to fail.

In order to solve the above-mentioned defects in the display panel, improvements may be made based on the following two aspects: firstly, it is possible to change the thin-film encapsulating process for the display panel and use other materials, however, this solution involves the development of new materials, and the material and process development cycle is long; secondly, it is possible to encapsulate the circular polarizing plate, but the encapsulating material used cannot affect the optical effect of the polarizing plate, and fluorine-based liquid encapsulation is commonly used currently. Embodiments of the present disclosure provide a new solution, by disposing an absorption layer 30 between the first inorganic layer 20 and the polarizing layer 44, the absorption layer 30 includes adsorbing particles for adsorbing ammonia gas and/or ammonium ions in the first inorganic layer 20 to solve the problem of failure of the polarizing plate 40 during high-temperature storage.

In addition to the function of absorbing the ammonia gas and the ammonium ions, the absorption layer 30 of the embodiment of the present disclosure is resistant to high temperatures, in particular to high temperatures of more than 95° C.

As shown in FIG. 1, in some embodiments, the absorption layer 30 may be implemented by adding an additional film layer between the first inorganic layer 20 and the polarizing plate 40. In order not to affect the function of reducing the reflectivity of the polarizing plate 40, in one embodiment, the phase difference of the absorption layer 30 is zero, in which case the polarizing plate 40 is a circular polarizing plate. In another embodiment, the absorption layer 30 has a phase difference of 45°, in which case the polarizing plate 40 is a linear polarizing plate. In this embodiment, the absorption layer 30 and the linear polarizing plate together function as a circular polarizing plate.

In some embodiments, the absorption layer 30 may also be implemented directly with a film layer between the polarizing layer 44 and the first inorganic layer 20 to avoid adding new processes, while adsorbing ammonia and/or ammonium ions to solve the problem of failure of the polarizing plate 40 during high temperature storage. Specifically, it may be implemented by adding the adsorbing particles to the film layer between the polarizing layer 44 and the first inorganic layer 20.

Figure 3:
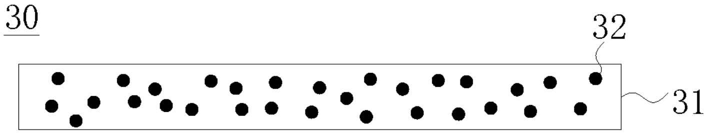
FIG. 3 is a schematic structural diagram of an absorption layer according to an embodiment of the present disclosure.

In particular, the above-mentioned solution can be realized by the following embodiments. Referring to FIG. 3, in a specific embodiment of the present disclosure, the absorption layer 30 includes a base 31 doped with adsorbing particles 32 that may adsorb ammonia gas and ammonium ions.

In an embodiment of the present disclosure, when the absorption layer 30 is an additional film layer newly added, the base 31 includes, but is not limited to, at least one of a cyclic olefin polymer (COP) or copolymers of cycloolefin (COC). Copolymers of cycloolefin COC refers to the copolymerization of cyclic olefin monomers with other monomers, and the copolymerization ratio has an effect on the transmittance and haze of the finished film. For the embodiment of the present disclosure, the more pure the content of the cyclic olefin in the base 31, the better, and therefore the base 31 of the embodiment of the present disclosure is for example, a COP film.

The COP film may be formed by a melt extrusion method, and has low moisture absorption, low water permeability, and high heat resistance)(>95°. The phase difference of the COP film can be achieved by controlling the stretching ratio of the film during preparation, and the larger the stretching ratio, the larger the phase difference. The phase difference of the COP film can be measured by professional detection equipment.

The synthesis of cyclic olefin polymers COP can be referred to the synthesis process as follows:

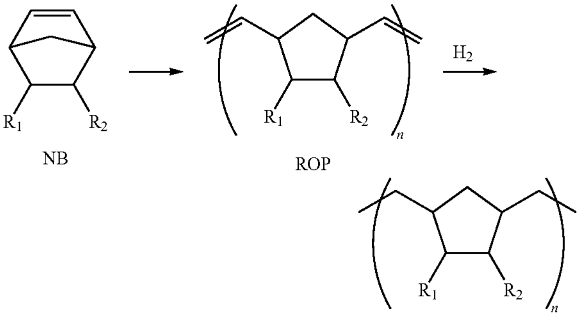

NB ROP COP

Where the entire synthesis process is a ROMP (Ring-Opening Metathesis Polymerization) reaction, NB is norbornylene, ROP is a ring-opening polymer, and R1 and R2 in the above-mentioned chemical formula are independently selected from non-polar groups. Specific synthesis procedures for COP materials can be referred to the prior art and will not be described herein.

In some embodiments of the present disclosure, the adsorbing particles 32 include, but are not limited to, zeolites, which may be natural zeolites, and materials thereof are at least one of potassium aluminosilicate, calcium aluminosilicate, sodium aluminosilicate, barium aluminosilicate, or strontium aluminosilicate. Zeolites have an adsorption effect on molecular ammonia and an ion exchange effect on ionic ammonia (ammonium ions).

In particular, in the composition structure of zeolites, $SiO_4$ and $AlO_4$ are joined in the form of a coangular apex to form a silicon-aluminum-oxygen lattice in which a number of wide pores and channels (50% or more of the total volume of the crystal) can be formed such that the zeolite has a very large specific surface area, typically at 450-1000 $m^2/g$. The zeolite has a uniform pore size, thus producing a "super-porous effect". Under the strong dispersion force of the zeolite surface, the cations distributed in the pores of the zeolite and the negative charge of partial oxygen of the lattice are balanced with each other, so that the zeolite has a strong electrostatic force. In addition, the zeolite has a relatively large gravitational field due to the large electrostatic attraction by the unique molecular structure of the zeolite. The zeolite has a strong adsorbability due to the combination of the above four factors. Compared with other adsorbents, the zeolite has the characteristics of large adsorbability, high selectivity, and high efficiency in adsorption.

Ion exchange refers to the chemical process in which a cation inside a zeolite crystal is exchanged with $NH_4^+$: in a silicon (aluminum) oxygen tetrahedral basic unit, the valence bond of a part of the oxygen atoms is not neutralized, so that the basic unit of the entire tetrahedron carries a part of the negative charges, and in order to achieve electrical neutralization, the positive charge lacking in the tetrahedral basic unit is compensated for by a nearby positively charged alkaline earth metal cation such as ($K^+$, $Na^+$, $Ca^{2+}$, $Mg^{2+}$); the diameter of $NH_4^+$ is smaller than the diameter of the pore channel of the zeolite, the $NH_4^+$ easily enters the pore to reach the surface of the zeolite by adsorption of the zeolite, and exchanges and replaces with the alkaline earth metal cation in the zeolite lattice, and the structure of the zeolite after ion exchange does not change, which makes the zeolite have ion exchange characteristics.

The doping ratio of the adsorbing particles 32 in the base 31 cannot be too large nor too low, the doping ratio that is too large may affect the light transmittance and the high-temperature resistance of the base 31, and the doping ratio that is too low may not effectively adsorb the ammonium ions and the molecular ammonia released from the inorganic layer. In an embodiment of the present disclosure, the percentage of the adsorbing particles 32 in the total mass of the absorption layer 30 is 8%~12%, specifically, 8%, 9%, 10%, 11%, 12%, or the like.

The particle size of the zeolite has a great influence on the equilibrium exchange capacity, the size of the exchange capacity is inversely proportional to the size of the particle size, and the exchange capacity of the zeolite is linearly related to the particle size in a certain range of particle sizes. In embodiments of the present disclosure, the particle size of the adsorbing particles 32 is less than or equal to 200 nanometers, within this range, the adsorbing particles may function to effectively adsorb ammonium ions, and in particular embodiments, the adsorbing particles may be selected from the group consisting of zeolites having a particle size of 200 nanometers, 180 nanometers or 150 nanometers to be doped in the base 31.

Figure 4:
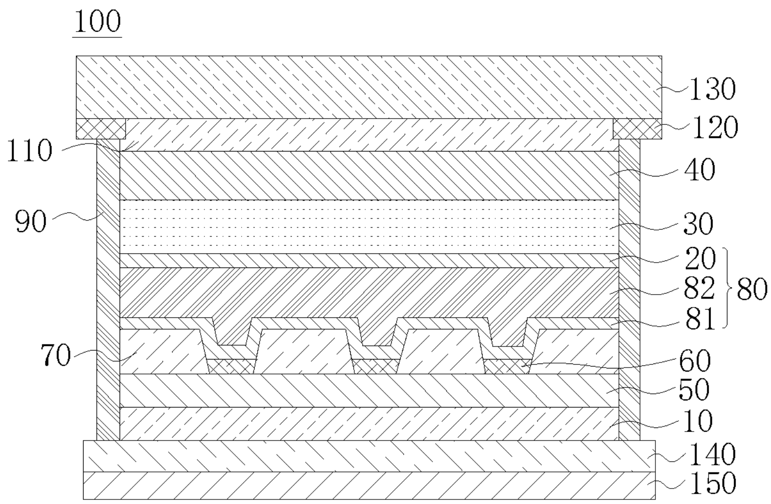
FIG. 4 is a schematic diagram of another structure according to an embodiment of the present disclosure.

Referring to FIG. 4, the present disclosure will be described with reference to a specific stacked structure of a display panel. The display panel 100 includes a substrate 10, a pixel driving circuit 50 disposed at a side of the substrate 10 close to the light emitting surface of the display panel 100, and a light emitting layer disposed on the pixel driving circuit 50. A side of the substrate 10 away from the light emitting surface of the display panel 100 is further provided with a back plate 140, and a side of the back plate 140 away from the substrate 10 is further provided with an SCF (Super Clean Foam) component 150. The sides of the display panel 100 are sealed with glue 90.

The pixel driving circuit 50 includes thin film transistors arranged in an array, the thin film transistor includes parts such as an active layer, a gate, a source, and a drain, and an inorganic layer, such as a gate insulating layer, an interlayer insulating layer, and a passivation layer, is disposed between corresponding stacked thin film layers formed by the parts of the thin film transistor. The light emitting layer includes an anode, a hole injection layer, a hole transport layer, a light-emitting material layer 60, an electron transport layer, an electron injection layer, and a cathode which are stacked. The hole injection layer, the hole transport layer, the electron transport layer, and the electron injection layer may be deposited on the whole surface by evaporation. The pixel driving circuit 50 is provided with a pixel definition layer 70, and the pixel definition layer 70 is provided with a plurality of pixel definition openings, and the light emitting material layer 60 can be formed in the pixel definition openings by ink-jet printing.

To prevent moisture and oxygen from eroding the light emitting layer, the light emitting layer is covered with a thin film encapsulation layer 80, which sequentially includes a second inorganic layer 81, an organic layer 82, and an inorganic layer 20 in a direction away from the light emitting layer, and the inorganic layer 20 is made of a material including $SiN_x$ or SiON.

An absorption layer 30 is provided on the thin film encapsulation layer 80, a polarizing plate 40 is provided on the absorption layer 30, and the polarizing plate 40 is attached to the cover plate 130 through the adhesive layer 110. The cover plate 130 is coated with a black ink layer 120 on the side close to the polarizing plate 40, and the black ink layer 120 is located in a frame area (non-display area) of the display panel 100, and serves as a shading function.

The display panel further includes a touch layer, which may be a on cell structure or a in cell structure, that is, the touch layer may be provided on the thin film encapsulation layer 80, or may be integrated inside the thin film encapsulation layer 80 (near a side of the substrate), specifically may be integrated in the pixel driving circuit 50.

Specifically, when the touch layer is provided inside of the thin film encapsulation layer 80 (in cell structure), the inorganic layer 20 of the thin film encapsulation layer 80 is an inorganic layer of the plurality of inorganic layers that is furthest away from the substrate, that is, the inorganic layer 20 of the thin film encapsulation layer 80 is a first inorganic layer.

When the touch layer is provided on the thin film encapsulation layer 80 (on cell structure), the touch layer is further provided with an inorganic layer to protect the touch layer. This inorganic layer is an inorganic layer, that is, a first inorganic layer, of the plurality of inorganic layers, which is furthest away from the substrate.

In some embodiments of the present disclosure, as shown in FIG. 2, the absorption layer 30 includes a base 31 doped with adsorbing particles 32 that may adsorb ammonia gas and ammonium ions.

In particular, the base 31 includes a COP film and the adsorbing particles 32 include zeolites. The adsorbing particles can physically adsorb molecular ammonia and have an ion exchange effect on ammonium ions. In the high temperature storage process, the absorption layer 30 can prevent the ammonium ions of the inorganic layer in the pixel driving circuit and the ammonium ions in the thin film encapsulation layer 80 from diffusing to the polarizing plate 40, thereby improving the reliability of the display panel 100.

In some embodiments of the present disclosure, the base 31 is a COP film having a phase difference of zero, and the polarizing plate 40 is a circular polarizing plate, so that the base 31 does not adversely affect the anti-reflection effect of the polarizing plate 40.

Figure 5:
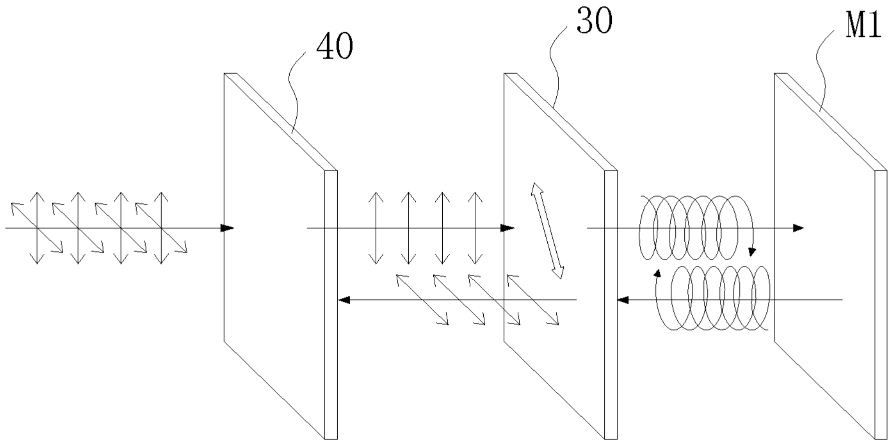
FIG. 5 is a schematic diagram showing a principle for reducing reflection through a combination of a COP film with a phase difference of 45° and a linear polarizing plate according to an embodiment of the present disclosure.

In other embodiments of the present disclosure, the base 31 is a COP film having a phase difference of 45°, and the polarizing plate 40 is a linear polarizing plate. A combination of the COP film having a phase difference of 45° and the linear polarizing plate corresponds to the circular polarizing plate. As shown in FIG. 5, FIG. 5 is a schematic diagram showing a principle for reducing reflection through a combination of a linear polarizing plate and a COP film with a phase difference of 45°. The COP film with a phase difference of 45° corresponds to a quarter-wave plate. When external ambient light is converted into vertical linear polarized light through a vertical linear polarizing plate, the vertical linear polarized light is converted into clockwise circular polarized light through the COP film with the phase difference of 45°, the clockwise circular polarized light is converted into counterclockwise circular polarized light after being reflected through a metal layer Ml (e.g., a cathode) of the display panel 100, and then the counterclockwise circular polarized light is converted into horizontal linear polarized light again through the COP film with a phase difference of 45°. As this time, when the horizontal linear polarized light hits the linear polarizing plate, it is blocked by the linear polarizing plate, thereby reducing the reflection of external ambient light.

The manufacturing technology of the linear polarizing plate is more mature than that of the circular polarizing plate, and the selection range is wider, but the optical effect is slightly worse than that of the circular polarizing plate. Therefore, in a specific embodiment, a combination of the COP film having a phase difference of 45° and the linear polarizing plate can be selected according to actual requirements.

Figure 6:
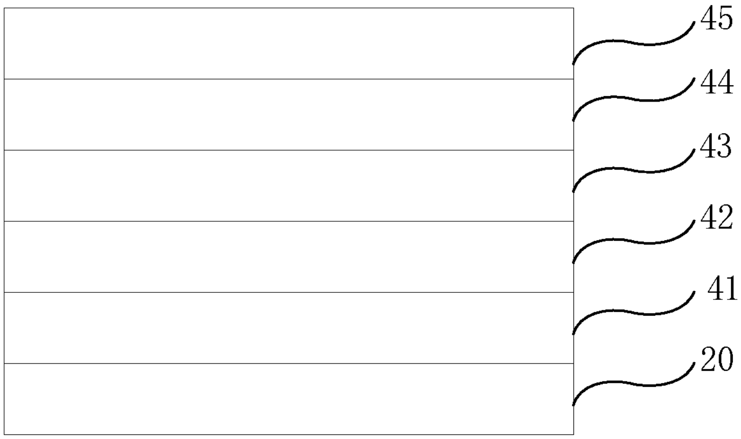
FIG. 6 is a schematic diagram of stacked film layers of a display panel according to another embodiment of the present disclosure.

In some embodiments, as shown in FIG. 6, film layers between the polarizing layer 44 and the first inorganic layer 20 may be used as a base for the absorption layer 30.

Specifically, the polarizing plate 40 includes the polarizing layer 44, a first protective layer 45 on a side of the polarizing layer 44 away from the first inorganic layer 20, a second protective layer 43 on a side of the polarizing layer 44 close to the first inorganic layer 20, and an adhesive layer 41 on a side of the second protective layer 43 close to the first inorganic layer 20. At least one of the second protective layer 43 or the adhesive layer 41 is reusable as a base 31 of the absorption layer 30. That is, the adsorbing particles 32 may be doped in the second protective layer 43, or the adsorbing particles 32 may be doped in the adhesive layer 41, so as to absorb ammonium ions or ammonia gas released by the first inorganic layer during the high temperature process, thereby preventing the ammonium ions or ammonia gas from entering the polarizing layer.

In some embodiments, when the polarizing plate 40 is a circular polarizing plate, the polarizing plate further includes a quarter-wave plate 42 between the adhesive layer 41 and the second protective layer 43, the quarter-wave plate 42 may be reusable as the base 31 of the absorption layer 30, i.e., the adsorbing particles may be doped in the quarter-wave plate 42.

In other embodiments, the adsorbing particles 32 may optionally be doped in the plurality of film layers to enhance the barrier to ammonium ion or ammonia gas. For example, the adsorbing particles 32 may be doped in the second protective layer 43, and the absorbing layer 30 may be added between the polarizing plate 40 and the first inorganic layer 20 at the same time. As another example, the adsorbing particles 32 may be doped simultaneously in the second protective layer 43 and the adhesive layer 41.

In summary, an embodiment of the present disclosure provides a display panel including a substrate, a first inorganic layer disposed on the substrate, a polarizing plate disposed on the first inorganic layer, and an absorption layer, the polarizing plate includes the polarizing layer, the absorption layer is disposed between the polarizing layer and the first inorganic layer, and the absorption layer includes adsorbing particles for adsorbing ammonia gas and/or ammonium ions. The absorption layer is disposed between the first inorganic layer and the polarizing layer to absorb the ammonia gas and/or ammonium ions released from the first inorganic layer during high-temperature storage, so as to prevent ammonia gas and ammonium ions from entering the polarizing plate, resulting in the failure of the polarizing plate, thereby improving the reliability of the display panel.

In the above-mentioned embodiments, the description of each embodiment has its own emphasis, and parts not described in detail in a certain embodiment may be referred to the related description of other embodiments.

A display panel provided in an embodiment of the present disclosure has been described in detail. The principles and embodiments of the present disclosure have been described with reference to specific embodiments, and the description of the above embodiments is merely intended to aid in the understanding of the technical solution of the present disclosure and its core idea. Those ordinary skilled in the art should understand that: they may still modify the technical solutions described in the foregoing embodiments, or replace some of the technical features equivalently. These modifications or replacements do not cause the essence of the corresponding technical solutions to deviate from the scope of the technical solutions of the embodiments of the present disclosure.

What is claimed is:

1. A display panel, comprising:

a substrate;

a first inorganic layer disposed on the substrate;

a polarizing plate disposed on the first inorganic layer, the polarizing plate comprising a polarizing layer; and an absorption layer disposed between the first inorganic layer and the polarizing layer, the absorption layer comprising adsorbing particles for adsorbing ammonia gas and/or ammonium ions, wherein the adsorbing particles comprise at least one of potassium aluminosilicate, calcium aluminosilicate, sodium aluminosilicate, barium aluminosilicate, or strontium aluminosilicate, the absorption layer comprises a base, and the adsorbing particles are doped in the base, and the polarizing plate further comprises a first protective layer at a side of the polarizing layer away from the first inorganic layer, a second protective layer at a side of the polarizing layer close to the first inorganic layer, an adhesive layer at a side of the second protective layer close to the first inorganic layer, and at least one of the second protective layer or the adhesive layer is further used as the base of the absorption layer.

2. The display panel according to claim 1, wherein a particle size of the adsorbing particles is less than or equal to 200 nm.

3. The display panel according to claim 1, wherein a percentage of the adsorbing particles in a total mass of the absorption layer is 8% ~12%.

4. The display panel according to claim 3, wherein a particle size of the adsorbing particles is less than or equal to 200 nm.

5. The display panel according to claim 1, wherein material of the base comprises at least one of cyclic olefin polymer or copolymers of cycloolefin.

6. The display panel according to claim 5, wherein the base has a phase difference of zero, and the polarizing plate is a circular polarizing plate.

7. The display panel according to claim 5, wherein the base has a phase difference of 45°, and the polarizing plate is a linear polarizing plate.

8. A display panel, comprising:
- a substrate;
- a first inorganic layer disposed on the substrate;
- a polarizing plate disposed on the first inorganic layer, the polarizing plate comprising a polarizing layer; and
- an absorption layer disposed between the first inorganic layer and the polarizing layer, the absorption layer comprising adsorbing particles for adsorbing ammonia gas and/or ammonium ions;
- wherein the adsorbing particles comprise at least one of potassium aluminosilicate, calcium aluminosilicate, sodium aluminosilicate, barium aluminosilicate, or strontium aluminosilicate,
- the absorption layer comprises a base, and the adsorbing particles are doped in the base, and
- the polarizing plate further comprises a quarter-wave plate located at a side of the polarizing layer close to the first inorganic layer, and the quarter-wave plate is further used as the base of the absorption layer.

9. The display panel according to claim 1, wherein the display panel comprises a plurality of inorganic layers, and the first inorganic layer is an inorganic layer of the plurality of inorganic layers furthest away from the substrate.

10. The display panel according to claim 9, wherein the display panel further comprises a light emitting layer disposed on the substrate, and a thin film encapsulation layer disposed on the light emitting layer and covering the light emitting layer, and the thin film encapsulation layer comprises a second inorganic layer, an organic layer, and the first inorganic layer stacked in sequence in a direction away from the substrate.

11. The display panel according to claim 10, wherein the display panel further comprises a touch layer disposed at a side of the thin film encapsulation layer close to the substrate.

12. The display panel according to claim 9, wherein the display panel further comprises a light emitting layer disposed on the substrate, a thin film encapsulation layer disposed on the light emitting layer and covering the light emitting layer, and a touch layer disposed on the thin film encapsulation layer, and the first inorganic layer is disposed on the touch layer and covers the touch layer.

13. The display panel according to claim 1, wherein material of the first inorganic layer comprises SiNx or SiON.

* * * * *